United States Patent
Chen et al.

(10) Patent No.: US 11,842,922 B2
(45) Date of Patent: Dec. 12, 2023

(54) METHOD FOR FORMING INTERCONNECT STRUCTURE

(71) Applicant: Taiwan Semiconductor Manufacturing Co., Ltd., Hsinchu (TW)

(72) Inventors: Chun-Kai Chen, Kaohsiung (TW); Jei Ming Chen, Tainan (TW); Tze-Liang Lee, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 217 days.

(21) Appl. No.: 17/399,262

(22) Filed: Aug. 11, 2021

(65) Prior Publication Data
US 2023/0050514 A1 Feb. 16, 2023

(51) Int. Cl.
*H01L 21/768* (2006.01)
*H01L 21/311* (2006.01)

(52) U.S. Cl.
CPC .......... *H01L 21/76811* (2013.01); *H01L 21/31116* (2013.01); *H01L 21/31144* (2013.01); *H01L 21/76816* (2013.01); *H01L 21/76877* (2013.01)

(58) Field of Classification Search
CPC ......... H01L 21/76811; H01L 21/31116; H01L 21/31144; H01L 21/76816; H01L 21/76877; H01L 21/76832; H01L 21/76834; H01L 21/32136; H01L 21/76813; H01L 21/76807; H01L 21/7681
See application file for complete search history.

(56) References Cited

U.S. PATENT DOCUMENTS

| | | | |
|---|---|---|---|
| 9,633,948 B2 * | 4/2017 | Brink | H01L 21/31144 |
| 10,867,840 B2 | 12/2020 | Su et al. | |
| 11,348,829 B2 | 5/2022 | Peng et al. | |
| 2011/0135557 A1 | 6/2011 | Rangarajan et al. | |
| 2013/0105996 A1 * | 5/2013 | Brink | H01L 21/31116 |
| | | | 438/618 |
| 2016/0111374 A1 * | 4/2016 | Brink | H01L 23/5226 |
| | | | 257/774 |
| 2020/0105585 A1 | 4/2020 | Su et al. | |
| 2023/0033038 A1 * | 2/2023 | Lin | H01L 21/0338 |

FOREIGN PATENT DOCUMENTS

| TW | I687977 B | 3/2020 |
|---|---|---|
| TW | 202029304 A | 8/2020 |
| TW | I740222 B | 9/2021 |

* cited by examiner

*Primary Examiner* — J. E. Schoenholtz
(74) *Attorney, Agent, or Firm* — Slater Matsil, LLP

(57) ABSTRACT

A method includes depositing a first dielectric layer over a first conductive feature, depositing a first mask layer over the first dielectric layer, and depositing a second mask layer over the first mask layer. A first opening is patterned in the first mask layer and the second mask layer, the first opening having a first width. A second opening is patterned in a bottom surface of the first opening, the second opening extending into the first dielectric layer, the second opening having a second width. The second width is less than the first width. The first opening is extended into the first dielectric layer and the second opening is extended through the first dielectric layer to expose a top surface of the first conductive feature.

20 Claims, 11 Drawing Sheets

101

METHOD FOR FORMING INTERCONNECT STRUCTURE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs.

Accompanying the scaling down of devices, manufacturers have begun using new and different materials and/or combination of materials to facilitate the scaling down of devices. Scaling down, alone and in combination with new and different materials, has also led to challenges that may not have been presented by previous generations at larger geometries.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
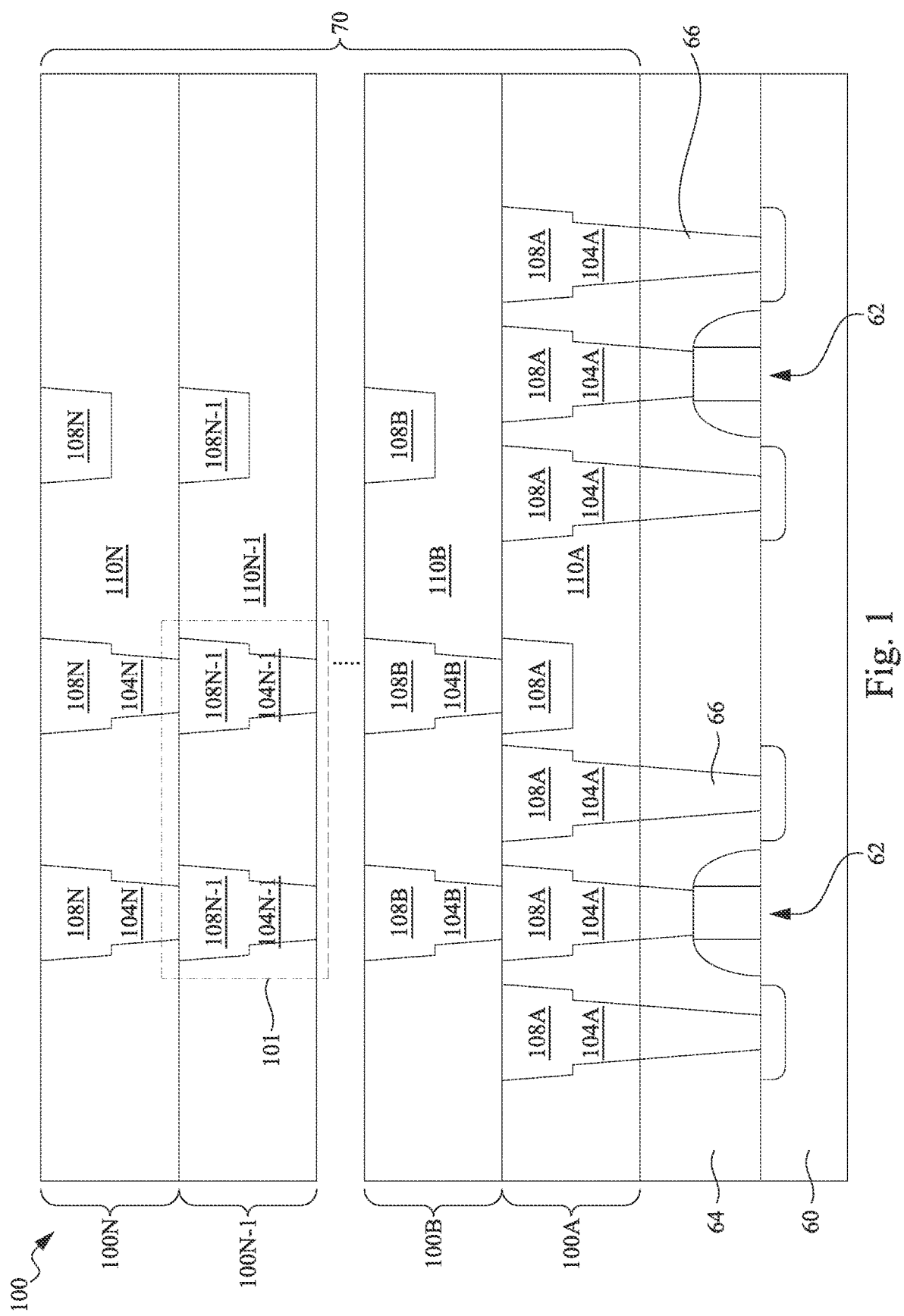
FIG. 1 illustrates a cross-sectional view of a semiconductor substrate and multilevel interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure includes, for example, methods of forming masks for the patterning of interconnect openings (including trenches and via openings) with a dual damascene process. For example, a mask may comprise a titanium-containing mask layer over a tungsten-containing mask layer. The titanium-containing mask layer may provide high etching selectivity with underlying dielectric materials for forming interconnect openings in the dielectric materials with a dual damascene process. The tungsten-containing mask layer may, by nature of having a strong physical modulus, reduce distortion of the interconnect openings. Further, inclusion of the tungsten-containing mask layer in the multi-layer mask helps reduce the quantity of non-volatile etching byproducts during the patterning of the interconnect openings, thereby reducing under-etching.

FIG. 1 illustrates a cross-sectional view of a semiconductor device 100, in accordance with some embodiments. The semiconductor device 100 includes a semiconductor substrate 60 comprising electronic devices, and an interconnect structure 70 over the semiconductor substrate 60 that interconnects the electronic devices to form an integrated circuit. FIG. 1 is a simplified view of the semiconductor device 100, and some features of the semiconductor device 100 (discussed below) are omitted for clarity of illustration.

The semiconductor substrate 60 may comprise a bulk semiconductor substrate or a silicon-on-insulator (SOI) substrate. An SOI substrate includes an insulator layer below a thin semiconductor layer that is the active layer of the SOI substrate. The semiconductor of the active layer and the bulk semiconductor generally comprise the crystalline semiconductor material silicon, but may include one or more other semiconductor materials such as germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

Devices 62 are formed at the active surface of the semiconductor substrate 60. The devices 62 may be active devices, passive devices, or a combination thereof. For example, the devices 62 may be transistors, diodes, capacitors, resistors, or the like, formed by any suitable formation method.

One or more inter-layer dielectric (ILD) layer(s) 64 are formed on the semiconductor substrate 60, and electrically conductive features, such as contacts 66 (also referred to as contact plugs), are formed physically and electrically coupled to the devices 62. The ILD layer(s) 64 may be formed of any suitable dielectric material, for example, an oxide such as silicon oxide, phosphosilicate glass (PSG), borosilicate glass (BSG), boron-doped phosphosilicate glass (BPSG), or the like; a nitride such as silicon nitride; or the like. The ILD layer(s) 64 may be formed by any suitable deposition process, such as spin coating, physical vapor deposition (PVD), chemical vapor deposition (CVD), the like, or a combination thereof. The contacts 66 may be formed by any suitable process, such as deposition, damascene (e.g., single damascene, dual damascene, etc.), the like, or combinations thereof.

The interconnect structure 70 includes multiple interconnect levels 100A-100N, which are stacked vertically above the contacts 66 and the ILD layer(s) 64. The interconnect structure 70 is formed in accordance with a back end of line (BEOL) scheme adopted for the integrated circuit design. In the BEOL scheme illustrated in FIG. 1, various interconnect levels 100A-100N have similar features. Other embodiments may utilize alternate integration schemes wherein the various interconnect levels 100A-100N use different features. For example, the contacts 66, which are shown as vertical connectors, may be extended to form conductive lines which transport current laterally. As will be subsequently described, the interconnect levels 100A-100N of the interconnect structure 70 are formed by a dual damascene process.

The interconnect levels 100A-100N of the interconnect structure 70 each comprise conductive vias and/or conductive lines embedded in an intermetal dielectric (IMD) layer. Generally, vias conduct current vertically and are used to electrically connect two conductive features located at vertically adjacent levels, whereas lines conduct current laterally and are used to distribute electrical signals and power within one interconnect level. In the bottom interconnect level 100A, conductive vias 104A connect contacts 66 to conductive lines 108A and, at subsequent interconnect levels 100B-100N, vias connect lines on a level below the vias to lines above the vias (e.g., a pair of conductive lines 108A and 108B are connected by a conductive via 104B). In some embodiments, the structures of the various interconnect levels (e.g., the bottom interconnect level 100A and the subsequent interconnect levels 100B-100N) may be similar. In the example illustrated in FIG. 1, each of the interconnect levels 100A-100N comprises conductive vias 104A-104N and conductive lines 108A-108N embedded in an IMD 110A-110N having a planar top surface. Other embodiments may adopt a different scheme. For example, conductive vias 104A may be omitted from the bottom interconnect level 100A and the contacts 66 may be directly connected to the conductive lines 108A.

FIGS. 2 through 10 illustrate cross-sectional views of a semiconductor device at various intermediate stages of fabrication, in accordance with some embodiments. Specifically, the formation of an interconnect level for an interconnect structure is illustrated. FIGS. 2 through 10 are detailed cross-sectional views of a region 101 of FIG. 1, showing a process for forming an intermediate interconnect level 100N-1 of an interconnect structure 70. However, any interconnect level of the interconnect structure may be formed using the process. For example, such a process may also be used to form the bottom interconnect level 100A (see FIG. 1) and/or the top interconnect level 100N (see FIG. 1) of the interconnect structure.

Figure 2:
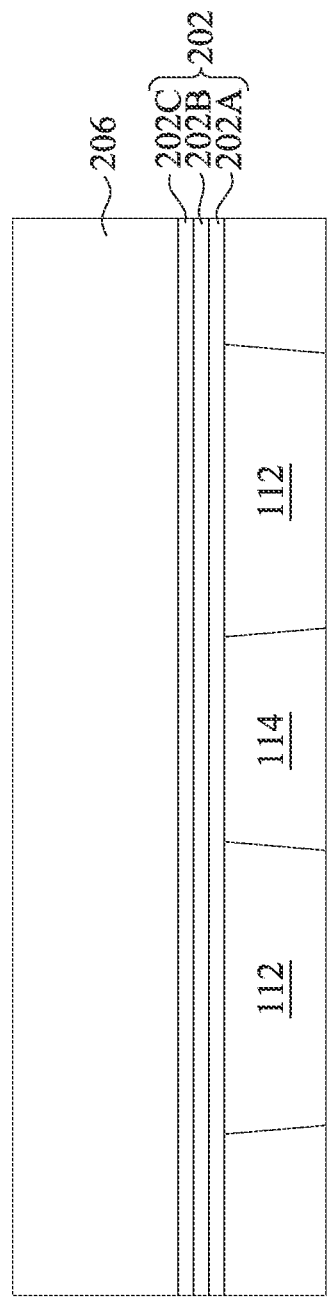
FIGS. 2 through 10 illustrate cross-sectional views of a semiconductor device at various intermediate stages of fabrication, in accordance with some embodiments.

FIG. 2 illustrates the formation of an etch stop layer (ESL) 202 and a dielectric layer 206. The ESL 202 and the dielectric layer 206 are formed over a dielectric layer 114 and conductive features 112. The dielectric layer 114 may be the IMD of an underlying interconnect level (e.g., the IMD 110B in FIG. 1) or may be an underlying ILD (e.g., the ILD(s) 64 in FIG. 1). The conductive features 112 may be a conductive line of an underlying interconnect level (e.g., the conductive lines 108B in FIG. 1) or may be an electrically conductive feature in an underlying ILD (e.g., the contacts 66 in FIG. 1).

In some embodiments, the ESL 202 is used for controlling subsequent etching processes to form a via opening (see below, FIG. 8). The ESL 202 may be any acceptable ESL, such as a single-layer ESL, a bi-layer ESL, a tri-layer ESL, or the like. In some embodiments, the ESL 202 is a tri-layer ESL comprising a bottom ESL 202A, a middle ESL 202B on the bottom ESL 202A, and a top ESL 202C on the middle ESL 202B. The ESL 202A comprises an insulating material, such as $AlO_x$, AlN, $Al_yO_x$, $ZrO_x$, $YO_x$, combinations thereof, or the like, having an etch rate different than an etch rate of the underlying dielectric layer 114 and the subsequently formed overlying material. The ESL 202A may be formed using PECVD, ALD, CVD, or the like. The ESL 202B comprises an insulating material, such as SiO, SiOC, SiCN, SiON, SiN, or the like. The ESL 202C may be formed of similar materials and by similar methods as described above for the ESL 202A. The ESL 202C may have an etch rate different than an etch rate of the underlying ESL 202B and the subsequently formed overlying material.

The dielectric layer 206 is formed on the ESL 202. The dielectric layer 206 is used to form the bulk of an inter metal dielectric (IMD) surrounding conductive vias and conductive lines of the interconnect level 100N-1 (see below, FIG. 10). In some embodiments, the dielectric layer 206 is formed of a porous or dense low dielectric constant (low-k) dielectric such as, e.g., silicon oxycarbide (SiOCH), fluorosilicate glass (FSG), carbon-doped oxide (CDO), a flowable oxide, porous oxides (e.g., xerogels/aerogels), phosphosilicate glass (PSG), borosilicate glass (BSG), boron-doped phosphosilicate glass (BPSG), undoped silicate glass (USG), the like, or a combination thereof. The dielectric layer 206 may also be referred to as a low-k dielectric layer. The dielectric material of the dielectric layer 206 may be deposited using any suitable method, such as CVD, PECVD, FCVD, spin-on coating, the like, or a combination thereof.

Figure 3:
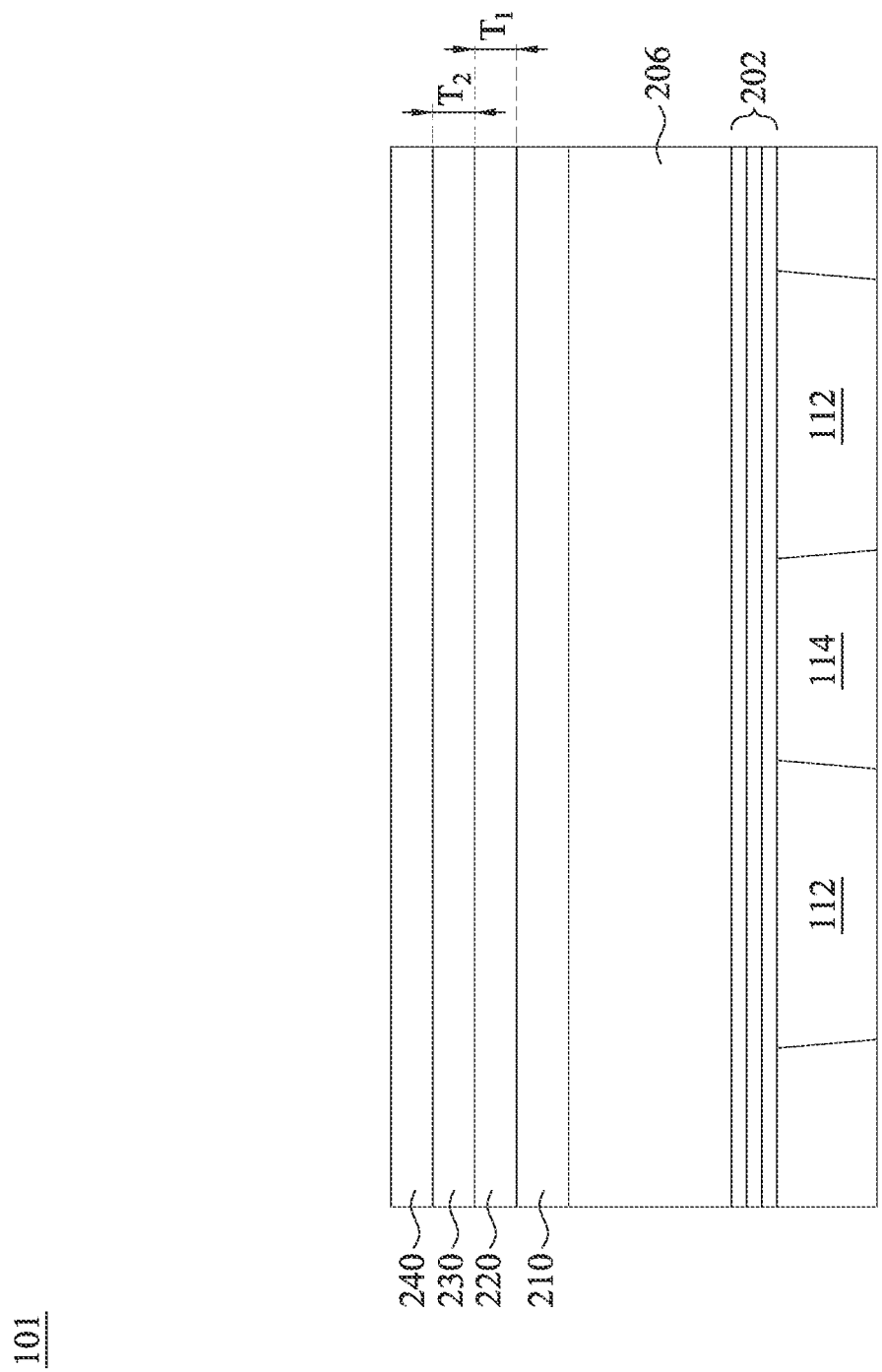

In FIG. 3, mask layers 210, 220, 230, and 240 are formed over the dielectric layer 206. The mask layers 210, 220, 230, and 240 are used to control subsequent etching processes to form openings and trenches for conductive vias and conductive lines, respectively (see below, FIGS. 7-8).

In some embodiments, the mask layer 210 is formed of a dielectric material such as silicon oxide, which may be formed, for example, using tetraethylorthosilicate (TEOS) as a precursor. The dielectric material of the mask layer 210 has a high etching selectivity from the etching of the mask layers 220 and 230 (described below). In some embodiments, the dielectric material of the mask layer 210 is a metal-free dielectric material. The formation methods of the material of the mask layer 210 may include Chemical Vapor Deposition (CVD), Plasma Enhance Chemical Vapor Deposition (PECVD), Sub Atmosphere Chemical Vapor Deposition (SACVD), or the like.

Next, the mask layer 220 is formed over the mask layer 210. The mask layer 220 is formed of a tungsten-containing mask material, such as tungsten carbide, which has a strong physical modulus for subsequent trench patterning (see below, FIGS. 5-8). In some embodiments, the tungsten-containing mask material has a Young's modulus in a range of 500 MPa to 2000 MPa. Because the tungsten-containing mask material has a strong physical modulus, the line width roughness (LWR) of the subsequently patterned trenches may be reduced. Additionally, byproducts of etching the tungsten-containing mask material during the trench patterning process may be volatile (e.g., gas phase instead of solid phase), so that the byproducts may be easily removed from the patterned trenches, which can reduce under-etching (see below, FIGS. 7-8). The material of the mask layer 220 may be formed using PECVD, Atomic Layer Deposition (ALD), CVD, Physical Vapor Deposition (PVD), or the like. The mask layer 220 may be formed to a first thickness $T_1$ in a range of 30 Å to 200 Å, which may be advantageous for providing a strong physical modulus for line patterning and reduce LWR of subsequently formed trenches in the dielectric layer 206. Forming the mask layer 220 to a thickness less than 30 Å may lead to increased LWR of subsequently formed conductive lines.

Next, the mask layer 230 is formed over the mask layer 220. The mask layer 230 is formed of a titanium-containing mask material, such as titanium nitride, which has a high etching selectivity from the etching of the mask layer 210 and the dielectric layer 206. In some embodiments, the titanium-containing mask material of the mask layer 230 has a greater etching selectivity from the etching of the mask layer 210 and the dielectric layer 206 than the tungsten-containing mask material of the mask layer 220. As such, the over-lay window for subsequently forming via openings and trenches in the dielectric layer 206 (see below, FIGS. 5-8) may be improved. The material of the mask layer 230 may be formed using PECVD, Atomic Layer Deposition (ALD), CVD, Physical Vapor Deposition (PVD), or the like. The mask layer 230 may be formed to a second thickness $T_2$ in a range of 20 Å to 100 Å, which may be advantageous for improving etching selectivity for subsequent etching processes. Forming the mask layer 230 to a thickness less than 20 Å may lead to poorer etching selectivity for subsequent etching processes.

Next, the mask layer 240 is formed over the mask layer 230. In some embodiments, the mask layer 220 is formed of a dielectric material such as silicon oxide, which has a high etching selectivity from the etching of the mask layers 220 and 230. The mask layer 240 may be formed of similar materials and by similar methods as described above for the mask layer 220.

Figure 4:
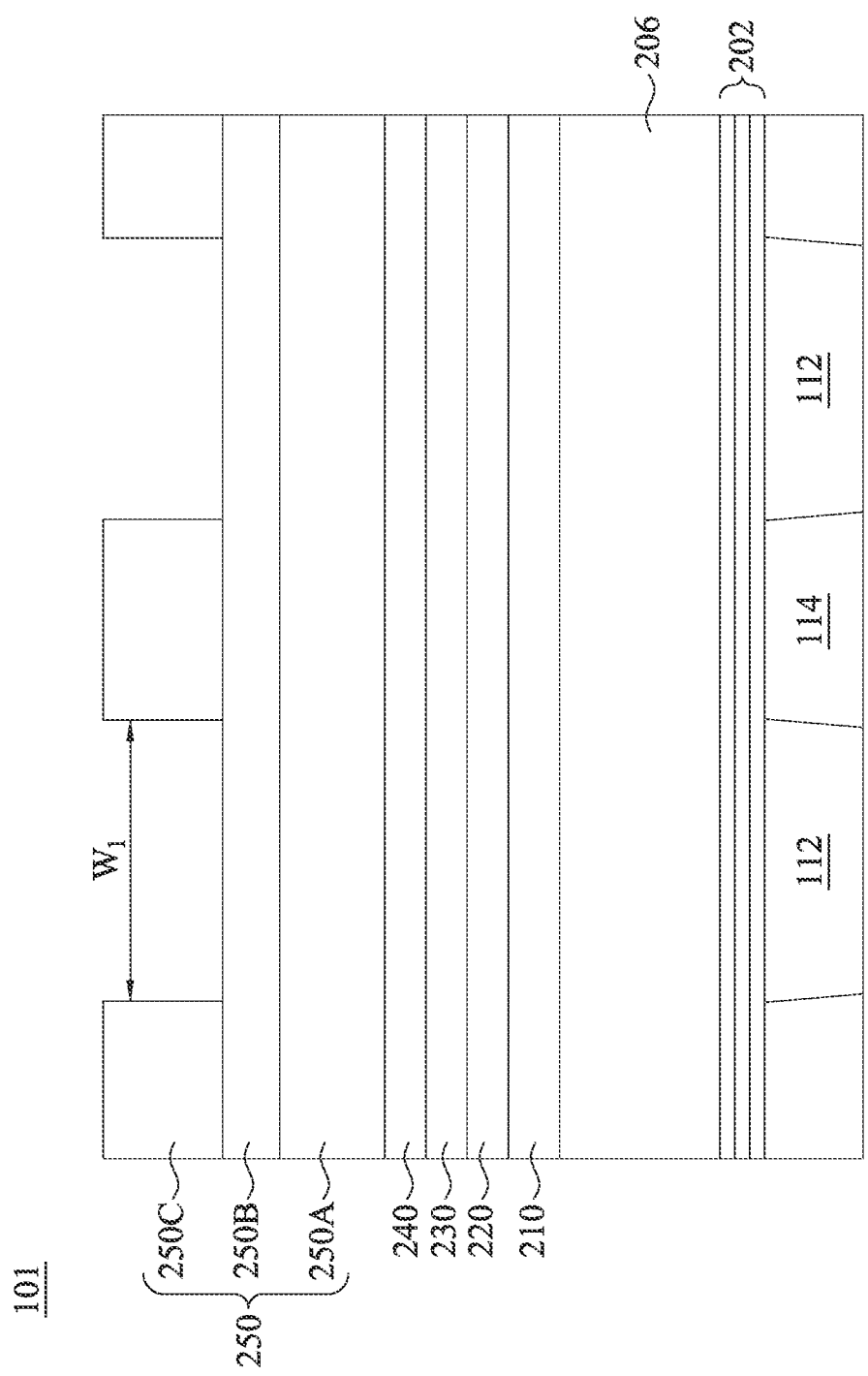

In FIG. 4, a photosensitive mask 250 is formed over the mask layer 240. The photosensitive mask 250 may be any acceptable photoresist, such as a single-layer photoresist, a bi-layer photoresist, a tri-layer photoresist, or the like. In the illustrated embodiment, the photosensitive mask 250 is a tri-layer photoresist including a bottom layer 250A, a middle layer 250B, and a top layer 250C. In some embodiments, the bottom layer 250A is formed of amorphous carbon, the middle layer 250B is formed of a silicon-containing photoresist or film, and the top layer 250C is formed of a photosensitive material. The top layer 250C is patterned with openings having first widths $W_1$ in a range of 5 nm to 40 nm, which are suitable for subsequently patterning trenches for conductive lines (see below, FIGS. 8-9) in the dielectric layer 206.

Figure 5:
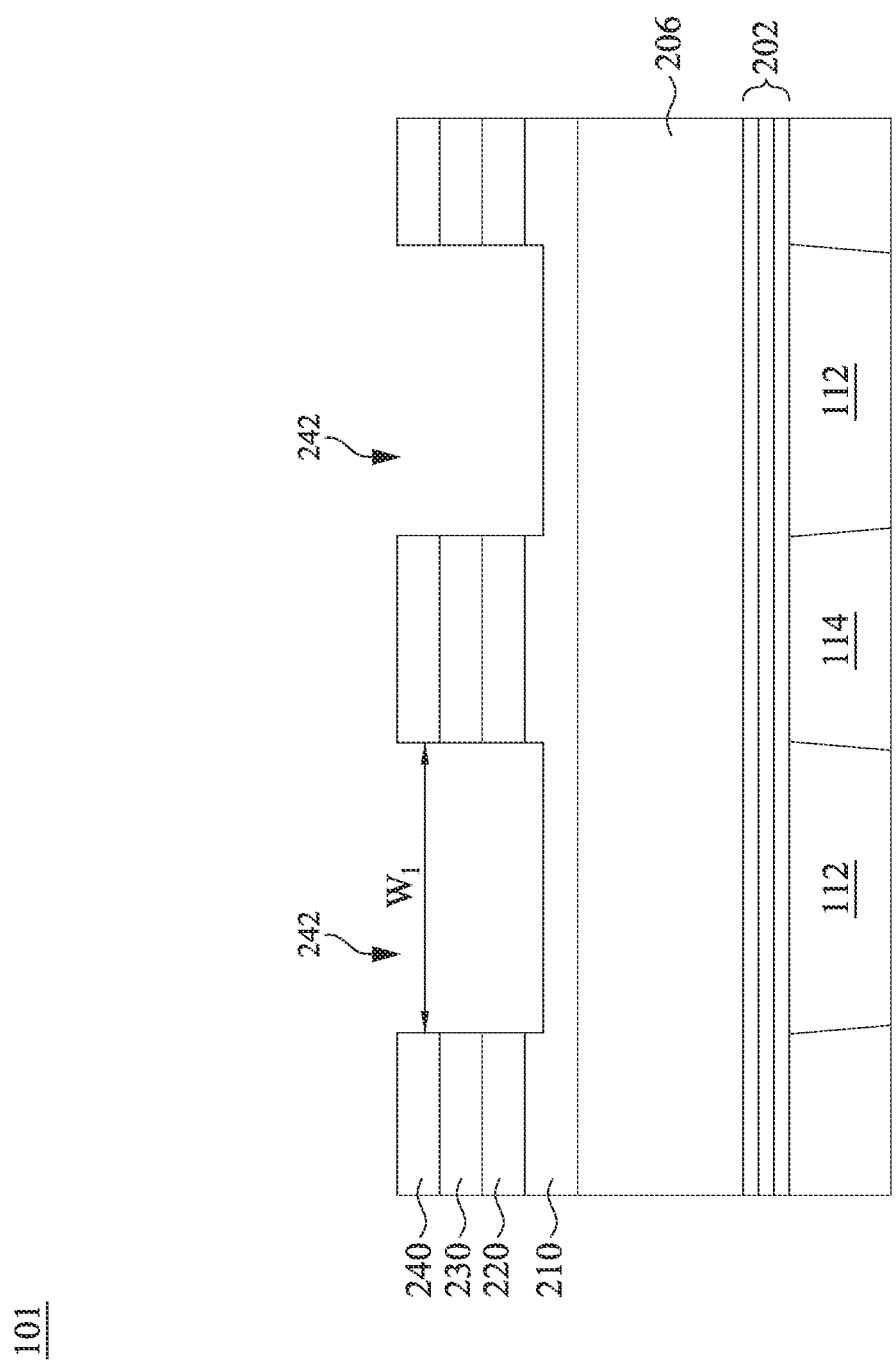

In FIG. 5, the photosensitive mask 250 is used as an etching mask to etch and pattern the mask layers 240, 230, and 220, thus forming masks having openings 242 that will be used in subsequent etching processes to form trenches for conductive lines in the dielectric layer 206. The openings 242 are formed through the mask layers 240, 230, and 220. In some embodiments, the openings 242 extend into (but not through) the mask layers 210. One or more layers of the photosensitive mask 250 may be consumed in the etching process, or may be removed after the etching process. In some embodiments, the photosensitive mask 250 is removed by an ashing process followed by a wet clean process. After the etching process and the removal of the photosensitive mask 250, remaining portions of the patterned mask layer 240 can have a reduced thickness. Alternatively, the thickness of the patterned mask layer 240 may be substantially unchanged by the etching process.

The etching may be any acceptable etch process, such as a reactive ion etch (RIE), neutral beam etch (NBE), the like, or a combination thereof. In some embodiments, the etch process is an anisotropic dry etch performed by a plasma process. The plasma etching process is performed in a processing chamber with process gas(es) being supplied into the processing chamber. In some embodiments, the plasma is a direct plasma. In some embodiments, the plasma is a remote plasma that is generated in a separate plasma generation chamber connected to the processing chamber. Process gas(es) can be activated into plasma by any suitable method of generating the plasma, such as transformer coupled plasma (TCP) systems, inductively coupled plasma (ICP) systems, capacitively coupled plasma (CCP) systems, magnetically enhanced reactive ion techniques, electron cyclotron resonance techniques, or the like.

The process gas(es) used in the plasma etching process include one or more etchant gas(es). In some embodiments, the etchant gas(es) are chlorine-based etchant gas(es) such as $Cl_2$, $BCl_3$, the like, or combinations thereof. Additional process gas(es) such as oxygen gas and/or hydrogen gas may also be used. Carrier gas(es), such as $N_2$, Ar, He, or the like, may be used to carry the process gas(es) into the processing chamber. The process gas(es) may be flowed into the processing chamber at a rate in a range of 100 sccm to 1000 sccm.

The plasma etching process may be performed using a bias voltage in a range of 50 volts to 500 volts. The plasma etching process may be performed using a plasma generation power in a range of 0 watts to 500 watts. The plasma etching process may be performed at a temperature in a range of 20° C. to 60° C. A pressure in the processing chamber may be in a range of 20 mTorr to 80 mTorr. The plasma etching process can be performed for a duration in a range of 50 seconds to 200 seconds. Performing the plasma etching process with etching parameters (e.g., bias voltage, duration, etc.) outside of the ranges discussed herein may cause undesirable under-etching or over-etching of the mask layers 210.

Figure 6:
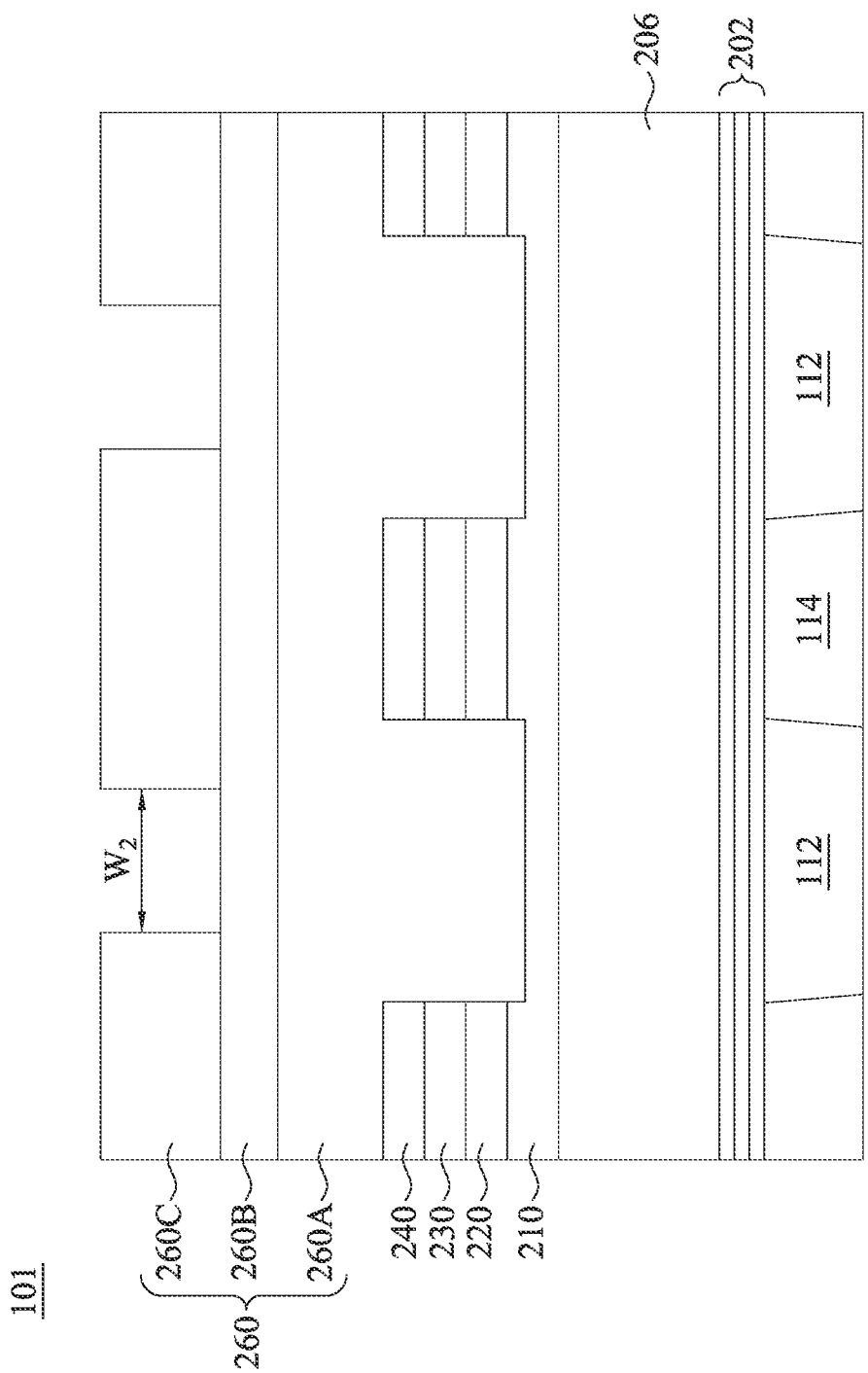

In FIG. 6, a photosensitive mask 260 is formed over the mask layer 240 and fills the openings 242. The photosensitive mask 260 may be any acceptable photoresist, such as a single-layer photoresist, a bi-layer photoresist, a tri-layer photoresist, or the like. In the illustrated embodiment, the photosensitive mask 260 is a tri-layer photoresist including a bottom layer 260A, a middle layer 260B, and a top layer 260C. In some embodiments, the photosensitive mask 260 is formed of similar materials and by similar methods as described above for the photosensitive mask 250 (see above, FIG. 4). The top layer 260C is patterned with openings having second widths $W_2$ in a range of 5 nm to 30 nm, which are suitable for subsequently patterning openings for conductive vias (see below, FIGS. 8-9) in the dielectric layer 206. The second widths $W_2$ are smaller than the first widths $W_1$ of the openings in the photosensitive mask 250 (see above, FIG. 4).

Figure 7:
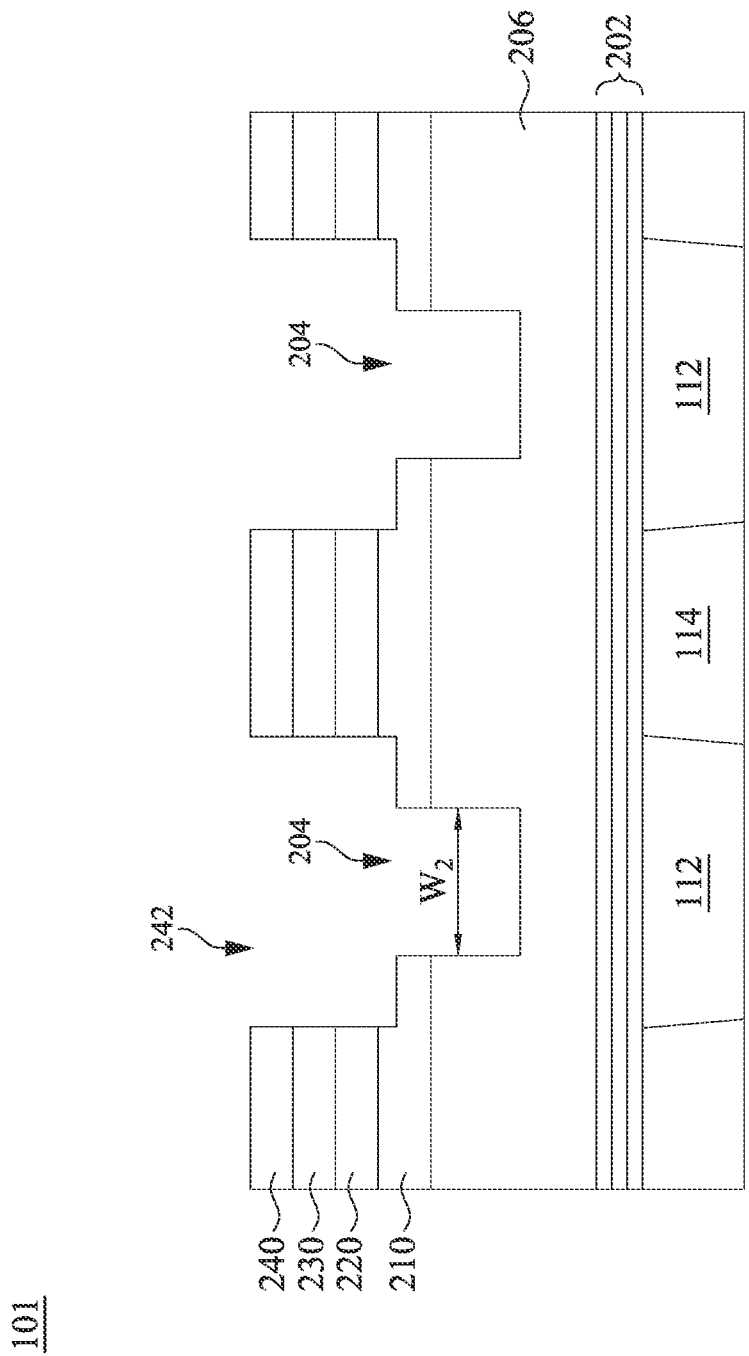

In FIG. 7, a patterning process is performed to transfer the pattern of the photosensitive mask 260 to the mask layer 210 and the dielectric layer 206. The patterning process forms via openings 204 through the mask layer 210 and extending into dielectric layer 206. In some embodiments, the patterning process may comprise one or more etching processes, where the photosensitive mask 260 is used as an etch mask. The one or more etching processes may include suitable anisotropic dry etching processes, such as a reactive ion etching (RIE) process, or the like. In some embodiments, the etch process is an anisotropic dry etch performed by a plasma process, such as the plasma etching process described above with respect to FIG. 5. In another embodiment, an etchant mixture for the etch process may comprise fluorine-based etchants, such as $C_xF_y$ (e.g., $CF_4$, $C_4F_8$, etc.), $NF_3$, the like, or combinations thereof, similar to the plasma etching process that will be described below with respect to FIG. 8. In some embodiments, the via openings 204 in the mask layer 210 and the dielectric layer 206 may have approximately the same width $W_2$ (see above, FIG. 6) as the openings in the photosensitive mask 260. Timed etching processes may be used to etch the dielectric layer 206 until the via openings 204 extend partially into the dielectric layer 206 by a desired distance. After forming the via openings 204 in the mask layer 210 and the dielectric layer 206, the photosensitive mask 260 (see above, FIG. 6) may be removed with a suitable process, such as an ashing process followed by a wet clean process.

Figure 8:
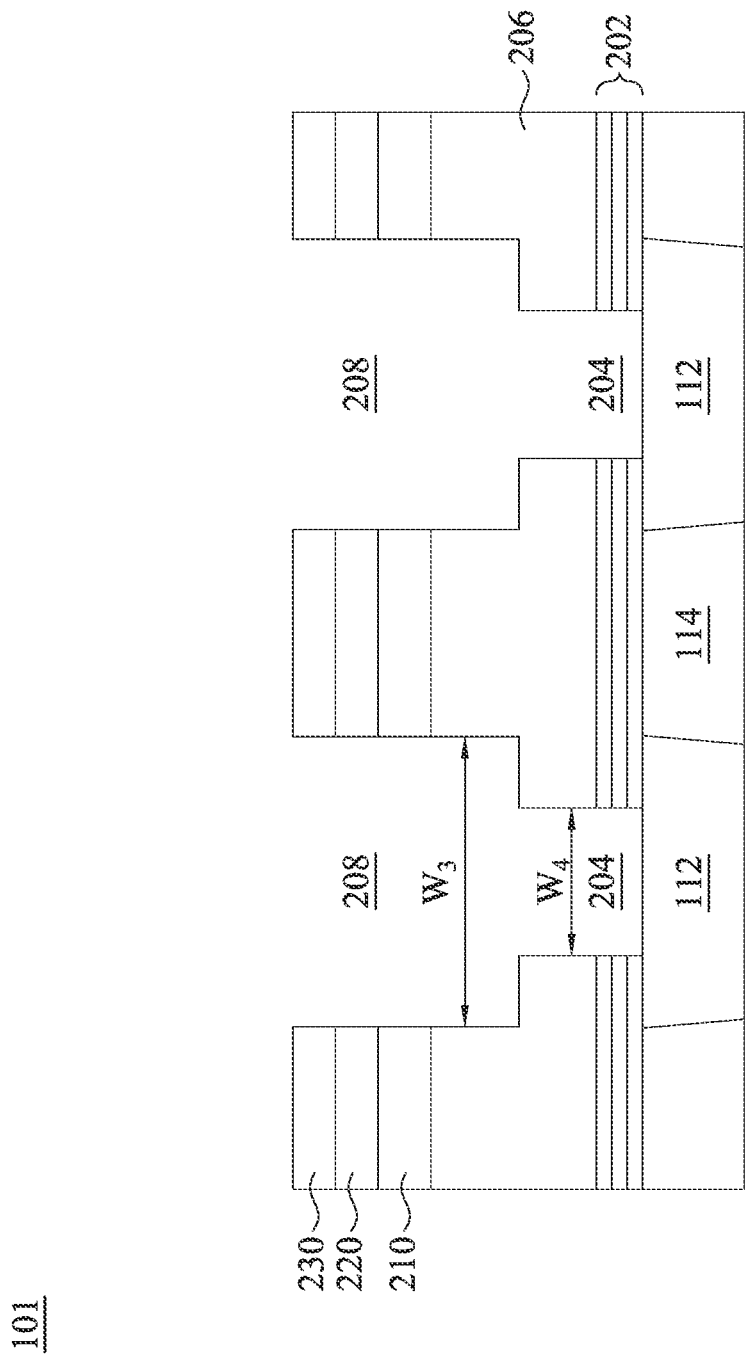

In FIG. 8, a patterning process is performed to transfer the pattern of the openings in the mask layers 220, 230, and 240 to the dielectric layer 206, thereby forming trenches 208 in the mask layer 210 and the dielectric layer 206, and extending the via openings 204 through the dielectric layer 206. After they are extended through the dielectric layer 206, the via openings 204 extend from the bottoms of the trenches 208 to the ESL 202. The via openings 204 and trenches 208 will be subsequently filled to form conductive vias and conductive lines, respectively (see below, FIGS. 9-10). As will be subsequently described in greater detail, the patterning process may comprise one or more etching processes, where the mask layers 220, 230, and 240 (see above, FIG. 7) are used as an etch mask, and portions of the mask layer 210 not covered by the mask layers 220, 230, and 240 are removed by the one or more etching processes so that the trenches 208 extend into the dielectric layer 206 and the via openings 204 extend through the dielectric layer 206. The etchant may be chosen to be selective to the material of the mask layers 210 and 240 and the dielectric layer 206, with little or no etching of the mask layers 220 and 230. In some embodiments, the mask layer 240 is removed by the one or more etching processes. For example, when the mask layers 210 and 240 are formed of the same material (e.g., silicon oxide), the mask layer 240 may be removed by the etching process used to form the trenches 208 in the mask layer 210 and the dielectric layer 206. The via openings 204 may then be extended through the ESL 202 by acceptable etching techniques to expose the top surfaces of the conductive features 112. In some embodiments, the trenches 208 have third widths W3 in a range of 5 nm to 40 nm, and the via openings 204 have fourth widths W4 in a range of 5 nm to 30 nm.

In some embodiments, the patterning process for the dielectric layer 206 may comprise one or more etching processes, where the mask layers 220, 230, and 240 are used as an etch mask. The etching may be any acceptable etch process, such as a reactive ion etch (RIE), neutral beam etch (NBE), the like, or a combination thereof. In some embodiments, the etch process is an anisotropic dry etch performed by a plasma process. The plasma etching process is performed in a processing chamber with process gas(es) being supplied into the processing chamber. In some embodiments, the plasma is a direct plasma. In some embodiments, the plasma is a remote plasma that is generated in a separate plasma generation chamber connected to the processing chamber. Process gas(es) can be activated into plasma by any suitable method of generating the plasma, such as transformer coupled plasma (TCP) systems, inductively coupled plasma (ICP) systems, capacitively coupled plasma (CCP) systems, magnetically enhanced reactive ion techniques, electron cyclotron resonance techniques, or the like.

The process gas(es) used in the plasma etching process include one or more etchant gas(es). In some embodiments, the etchant gas(es) are fluorine-based etchant gas(es) such as $C_xF_y$ (e.g., $CF_4$, $C_4F_8$, etc.), $NF_3$, the like, or combinations thereof. Additional process gas(es) such as oxygen gas, hydrogen gas, and/or $C_xO_y$ gas, may also be used. Carrier gas(es), such as $N_2$, Ar, He, or the like, may be used to carry the process gas(es) into the processing chamber. The process gas(es) may be flowed into the processing chamber at a rate in a range of 100 sccm to 1000 sccm.

The plasma etching process may be performed using a bias voltage in a range of 30 volts to 1000 volts. The plasma etching process may be performed using a plasma generation power in a range of 30 watts to 1000 watts. The plasma etching process may be performed at a temperature in a range of 20° C. to 60° C. A pressure in the processing chamber may be in a range of 3 mTorr to 80 mTorr. The plasma etching process can be performed for a duration in a range of 30 seconds to 200 seconds. Performing the plasma etching process with etching parameters (e.g., bias voltage, duration, etc.) outside of the ranges discussed herein may cause undesirable under-etching or over-etching of the dielectric layer 206.

As noted above, the mask layer 220 is formed of a tungsten-containing mask material and the mask layer 230 is formed of a titanium-containing mask material. In some embodiments in which fluorine-based etchant gas(es) are used to transfer the pattern of the photosensitive mask 260 to the mask layer 210 and the dielectric layer 206, the etchant gas(es) may react with the titanium-containing mask material to form titanium-containing byproducts such as $TiF_4$, and the etchant gas(es) may react with the tungsten-containing mask material to form tungsten-containing byproducts such as $WF_6$. For example, when the mask layer 220 is formed of tungsten carbide (WC) and the etchant gas(es) include oxygen ($O_2$) and nitrogen trifluoride ($NF_3$), byproducts such as tungsten hexafluoride ($WF_6$), carbon monoxide (CO), and carbon fluoride ($C_xF_y$) may be formed according to: $WC+O_2+NF_3 \rightarrow WF_6+CO+C_xF_y$. Remaining byproducts on the sidewalls or bottom surfaces of the openings 242 and 204 may lead to under-etching of subsequently formed trenches and openings for conductive lines and conductive vias, which can cause increased contact resistance and degradation of device performance. Because $TiF_4$ has a boiling point of about 284° C., it may be difficult to remove from the sidewalls or bottom surfaces of the openings 242 and 204. Advantageously, $WF_6$ has a boiling point of about 17° C., so it may be easily removed from the sidewalls or bottom surfaces of the openings 242 and 204 by, e.g., sublimation or evaporation at room temperature (e.g., about 25° C.). In some embodiments, the plasma etching process is performed at a temperature that is above the boiling point of $WF_6$ and below the boiling point of $TiF_4$, such as at about room temperature of about 25° C.

Using the mask layer 220 in combination with the mask layer 230 allows for a reduction in titanium-containing byproducts, as compared to using a thicker mask layer 230 without the mask layer 220. Further, using the mask layer 230 in combination with the mask layer 220 retains the advantages of a titanium-containing mask material, such as improving etching selectivity from the etching of the mask layer 210 and the dielectric layer 206, as compared to using a thicker mask layer 220 without the mask layer 230.

Figure 9:
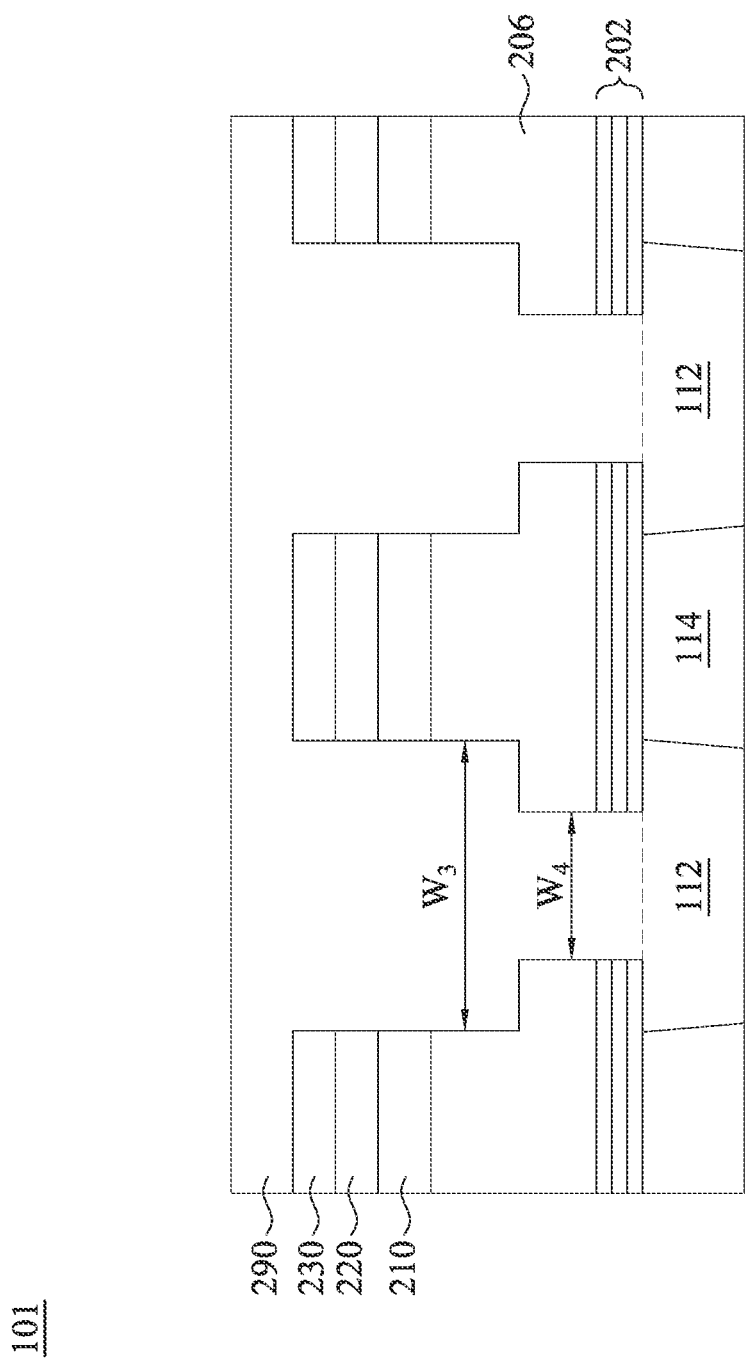

In FIG. 9, a conductive material 290 is formed over the structure to fill (or overfill) the via openings 204 and the trenches 208 (see above, FIG. 8). In some embodiments, the conductive material 290 includes a conductive diffusion barrier liner lining the sidewalls and bottom surfaces of the via openings 204 and the trenches 208, and a conductive fill material over the conductive diffusion barrier liner. The conductive diffusion barrier liner may reduce out-diffusion of conductive materials into the dielectric layer 206. The conductive diffusion barrier line may comprise one or more layers of TaN, Ta, TiN, Ti, Co, the like, or combinations thereof. The conductive diffusion barrier liner may be deposited by any suitable method, such as CVD, PECVD, PVD, ALD, PEALD, electrochemical plating (ECP), electroless plating and the like. The conductive fill material may comprise metals such as Cu, W, Co, Ru, CuMn, Mo, Al, or the like, or combinations thereof, or multi-layers thereof. The conductive fill material may be deposited by any suitable method, for example, CVD, PECVD, PVD, ALD, PEALD, electrochemical plating (ECP), electroless plating and the like. In some embodiments, a thin conductive seed layer may be deposited over the conductive diffusion barrier liner to help initiate an ECP process in which the conductive fill material fills the openings. In some embodiments, the conductive seed layer may be of the same conductive material as the conductive fill material and may be deposited using a suitable deposition technique (e.g., CVD, PECVD, ALD, PEALD, or PVD, or the like).

Figure 10:
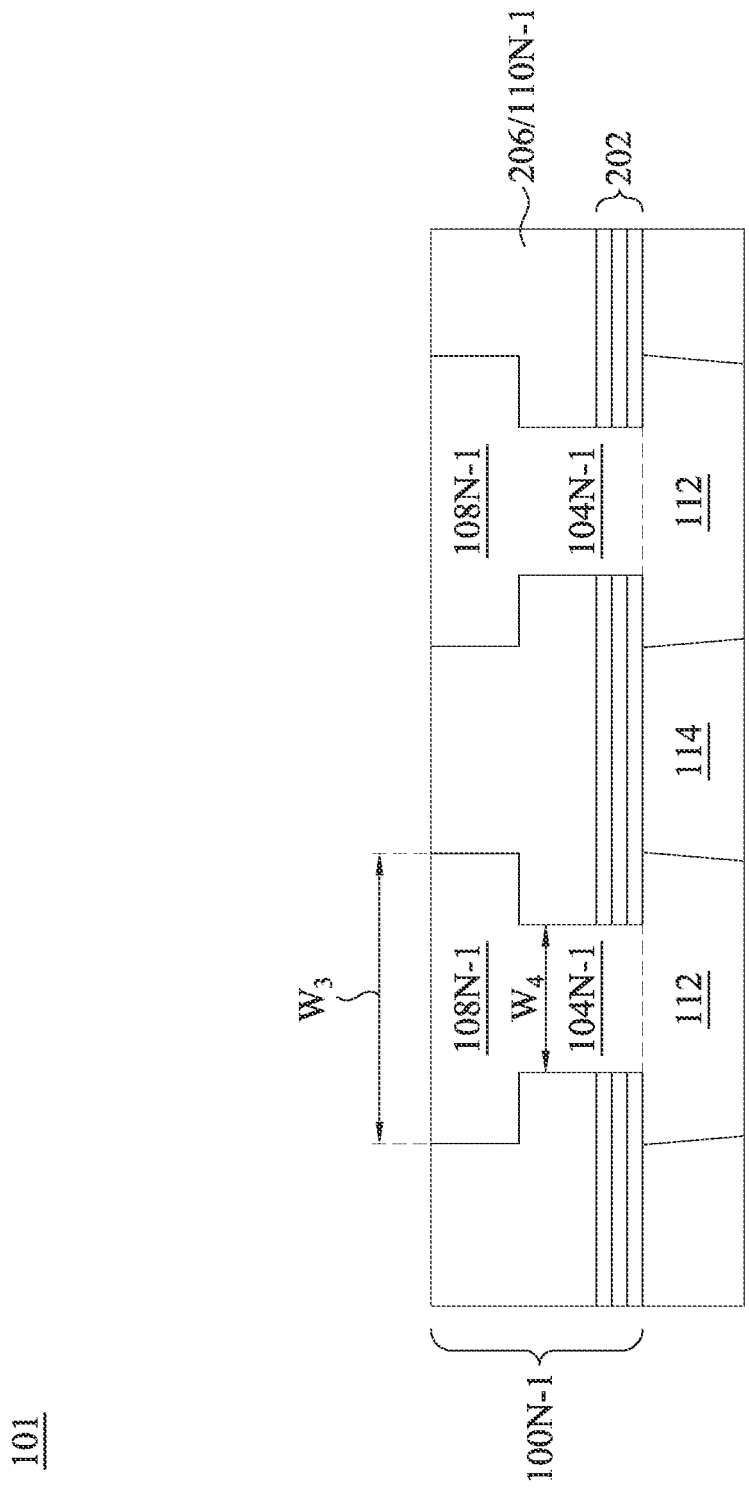

In FIG. 10, a removal process is performed to remove excess portions of the conductive material 290, which excess portions are over the top surface of the dielectric layer 206. The removal process also removes the remaining portions of the mask layers 210, 220, and 230 (see above, FIG. 9) over the dielectric layer 206. After the removal process, the conductive material 290 has portions remaining in the via openings 204 (thus forming conductive vias 104N-1) and has portions remaining in the trenches 208 (thus forming conductive lines 108N-1). The remaining portions of the dielectric layer 206 are an IMD 110N-1 that is disposed around the conductive vias 104N-1 and the conductive lines 108N-1. The removal process may be a planarizing process such as a CMP or the like. After the planarizing process, top surfaces of the conductive lines 108N-1 and the IMD 110N-1 are coplanar (within process variations). The removal process completes fabrication of the interconnect level 100N-1, which comprises conductive vias 104N-1 and conductive lines 108N-1 embedded in IMD 110N-1.

Figure 11:
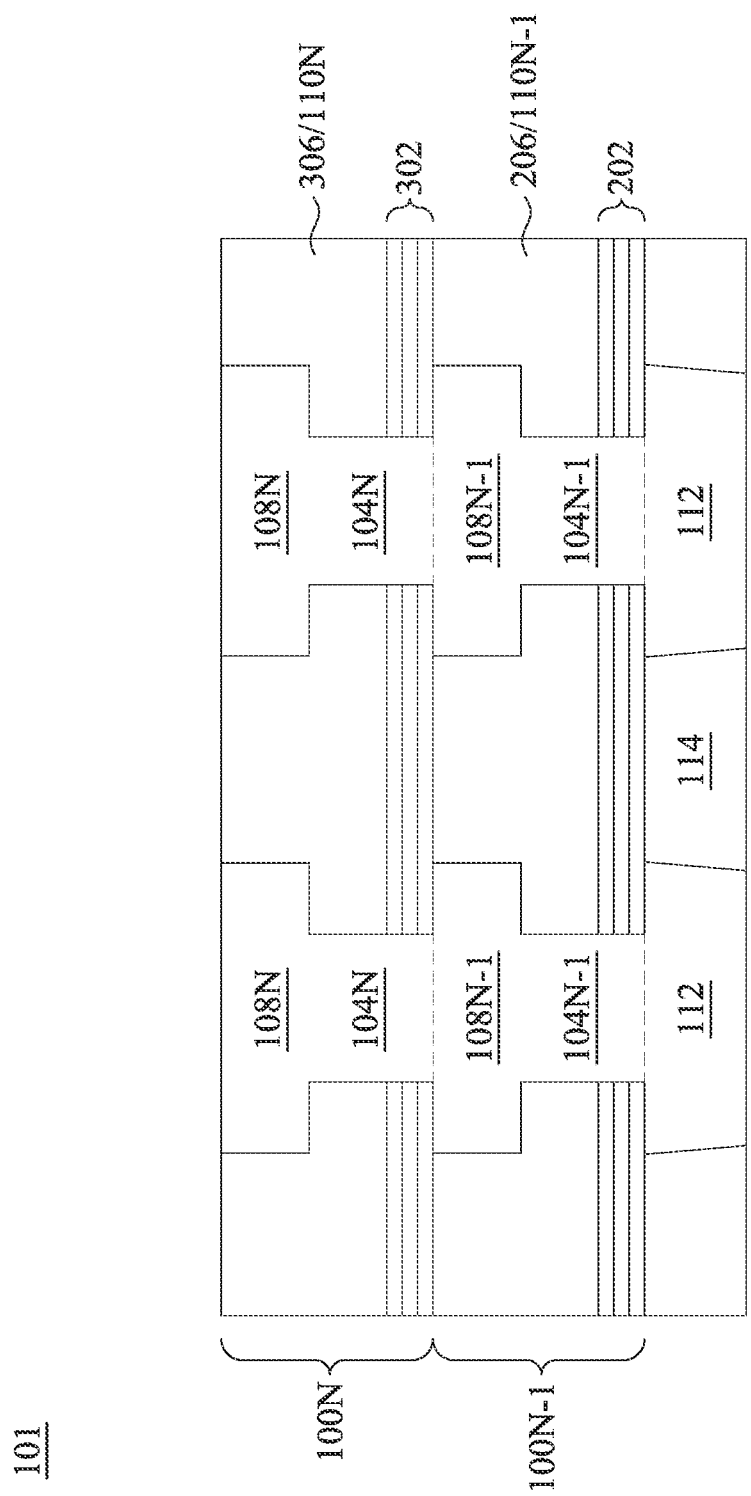
FIG. 11 illustrates a cross-sectional view of a semiconductor device at an intermediate stage of fabrication, in accordance with some embodiments.

Additional interconnect levels may be formed after the process described for FIGS. 2-10. FIG. 11 illustrates an interconnect level 100N which is formed on the intermediate interconnect level 100N-1. The interconnect level 100N comprises a conductive via 104N and a conductive line 108N in an IMD 110N. The IMD 110N is formed from, e.g., a dielectric layer 306. The interconnect level 100N may be formed of similar materials and by similar methods as described above for the interconnect level 100N-1 (see above, FIGS. 2-10).

Embodiments may achieve advantages. Multi-layer masks including a titanium-containing mask layer over a tungsten-containing mask layer are formed for the patterning of interconnect openings (including trenches and via openings) with a dual damascene process. The titanium-containing mask layer may have improved etching selectivity with underlying dielectric materials for patterning the interconnect openings. The tungsten-containing mask layer may have a strong physical modulus, which may reduce the line width roughness (LWR) of subsequently formed conductive lines. Further, inclusion of the tungsten-containing mask layer in the multi-layer mask helps reduce the quantity of non-volatile etching byproducts during the patterning of the interconnect openings, thereby reducing under-etching.

In accordance with an embodiment, a method includes: depositing a first dielectric layer over a first conductive feature; depositing a first mask layer over the first dielectric layer, the first mask layer including tungsten carbide; depositing a second mask layer over the first mask layer, the second mask layer including titanium nitride; patterning a first opening in the first mask layer and the second mask layer, the first opening having a first width; patterning a second opening in a bottom surface of the first opening, the second opening extending into the first dielectric layer, the second opening having a second width, the second width being less than the first width; and extending the first opening into the first dielectric layer and extending the second opening through the first dielectric layer to expose a top surface of the first conductive feature. In an embodiment, the first mask layer has a first thickness in a range of 30 Å to 200 Å. In an embodiment, the second mask layer has a second thickness in a range of 20 Å to 100 Å. In an embodiment, the method further includes filling the first opening and the second opening with a conductive material. In an embodiment, filling the first opening forms a conductive line in the first opening, the conductive line having a third width in a range of 5 nm to 40 nm. In an embodiment, filling the second opening forms a conductive via in the second opening, the conductive via having a fourth width in a range of 5 nm to 30 nm. In an embodiment, the method further includes forming a third mask layer over the second mask layer. In an embodiment, the third mask layer includes silicon oxide.

In accordance with another embodiment, a method includes: depositing a first mask layer over a low-k dielectric layer, the first mask layer being silicon oxide; depositing a second mask layer over the first mask layer, the second mask layer being tungsten carbide; depositing a third mask layer over the second mask layer, the third mask layer being titanium nitride; depositing a fourth mask layer over the third mask layer, the fourth mask layer being silicon oxide; patterning the second mask layer, the third mask layer, and the fourth mask layer to form a trench; extending the trench into the low-k dielectric layer by etching through the first mask layer; forming a conductive line by filling the trench with a conductive material; and removing the first mask layer, the second mask layer, the third mask layer, and the fourth mask layer. In an embodiment, etching through the first mask layer includes etching the first mask layer with a fluorine-based etchant. In an embodiment, the second mask layer has a Young's modulus in a range of 500 MPa to 2000 MPa. In an embodiment, removing the fourth mask layer is performed while etching through the first mask layer. In an embodiment, forming the conductive line includes planarizing the conductive material, and wherein the first mask layer, the second mask layer, and the third mask layer are removed by the planarizing of the conductive material.

In accordance with yet another embodiment, a method includes: forming a first mask layer over a first dielectric layer, the first dielectric layer being over a first conductive feature, the first mask layer including tungsten carbide; forming a second mask layer over the first mask layer, the second mask layer including titanium nitride; patterning the first mask layer and the second mask layer; and after patterning the first mask layer and the second mask layer, forming an opening extending into the first dielectric layer by etching the first dielectric layer with a fluorine-based etchant using the first mask layer and the second mask layer as an etching mask, the opening exposing a top surface of the first conductive feature, the etching the first dielectric layer with the fluorine-based etchant being performed at a first temperature, wherein a first byproduct of the fluorine-based etchant with the first mask layer has a boiling point less than the first temperature. In an embodiment, a second byproduct of the fluorine-based etchant with the second mask layer has a boiling point greater than the first temperature. In an embodiment, the second byproduct is $TiF_4$. In an embodiment, the first byproduct is $WF_6$. In an embodiment, the etching the first dielectric layer is performed with a plasma etching process, and the fluorine-based etchant is $CF_4$. In an embodiment, the plasma etching process is performed at a temperature in a range of 20° C. to 60° C. In an embodiment, the first temperature is room temperature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a first dielectric layer over a first conductive feature;
   depositing a first mask layer over the first dielectric layer, the first mask layer comprising tungsten carbide;
   depositing a second mask layer over the first mask layer, the second mask layer comprising titanium nitride;
   patterning a first opening in the first mask layer and the second mask layer, the first opening having a first width;
   patterning a second opening in a bottom surface of the first opening, the second opening extending into the first dielectric layer, the second opening having a second width, the second width being less than the first width; and
   extending the first opening into the first dielectric layer and extending the second opening through the first dielectric layer to expose a top surface of the first conductive feature.

2. The method of claim 1, wherein the first mask layer has a first thickness in a range of 30 Å to 200 Å.

3. The method of claim 1, wherein the second mask layer has a second thickness in a range of 20 Å to 100 Å.

4. The method of claim 1, further comprising filling the first opening and the second opening with a conductive material.

5. The method of claim 4, wherein filling the first opening forms a conductive line in the first opening, the conductive line having a third width in a range of 5 nm to 40 nm.

6. The method of claim 4, wherein filling the second opening forms a conductive via in the second opening, the conductive via having a fourth width in a range of 5 nm to 30 nm.

7. The method of claim 1, further comprising forming a third mask layer over the second mask layer.

8. The method of claim 7, wherein the third mask layer comprises silicon oxide.

9. A method comprising:
   depositing a first mask layer over a low-k dielectric layer, the first mask layer being silicon oxide;
   depositing a second mask layer over the first mask layer, the second mask layer being tungsten carbide;
   depositing a third mask layer over the second mask layer, the third mask layer being titanium nitride;
   depositing a fourth mask layer over the third mask layer, the fourth mask layer being silicon oxide;
   patterning the second mask layer, the third mask layer, and the fourth mask layer to form a trench;
   extending the trench into the low-k dielectric layer by etching through the first mask layer;
   forming a conductive line by filling the trench with a conductive material; and
   removing the first mask layer, the second mask layer, the third mask layer, and the fourth mask layer.

10. The method of claim 9, wherein etching through the first mask layer comprises etching the first mask layer with a fluorine-based etchant.

11. The method of claim 9, wherein the second mask layer has a Young's modulus in a range of 500 MPa to 2000 MPa.

12. The method of claim 9, wherein removing the fourth mask layer is performed while etching through the first mask layer.

13. The method of claim 9, wherein forming the conductive line comprises planarizing the conductive material, and wherein the first mask layer, the second mask layer, and the third mask layer are removed by the planarizing of the conductive material.

14. A method comprising:
   forming a first mask layer over a first dielectric layer, the first dielectric layer being over a first conductive feature, the first mask layer comprising tungsten carbide;
   forming a second mask layer over the first mask layer, the second mask layer comprising titanium nitride;
   patterning the first mask layer and the second mask layer; and
   after patterning the first mask layer and the second mask layer, forming an opening extending into the first dielectric layer by etching the first dielectric layer with a fluorine-based etchant using the first mask layer and the second mask layer as an etching mask, the opening exposing a top surface of the first conductive feature, the etching the first dielectric layer with the fluorine-based etchant being performed at a first temperature, wherein a first byproduct of the fluorine-based etchant with the first mask layer has a boiling point less than the first temperature.

15. The method of claim 14, wherein a second byproduct of the fluorine-based etchant with the second mask layer has a boiling point greater than the first temperature.

16. The method of claim 15, wherein the second byproduct is $TiF_4$.

17. The method of claim 14, wherein the first byproduct is $WF_6$.

18. The method of claim 14, wherein the etching the first dielectric layer is performed with a plasma etching process, and the fluorine-based etchant is $CF_4$.

19. The method of claim 18, wherein the plasma etching process is performed at a temperature in a range of 20° C. to 60° C.

20. The method of claim 14, wherein the first temperature is room temperature.

* * * * *